United States Patent [19]
Fawkes et al.

[11] 4,438,466
[45] Mar. 20, 1984

[54] D.C. CONTROLLED ADJUSTABLE RAMP SIGNAL GENERATOR AND METHOD

[75] Inventors: John S. Fawkes; Walter F. Umholtz, both of San Jose, Calif.

[73] Assignee: Ampex Corporation, Redwood City, Calif.

[21] Appl. No.: 364,735

[22] Filed: Apr. 2, 1982

[51] Int. Cl.³ ............................ G11B 5/47; G11B 5/02
[52] U.S. Cl. ...................................... 360/66; 307/263; 328/185; 360/68
[58] Field of Search ...................... 360/66, 68; 307/263; 328/185, 127

[56] References Cited

U.S. PATENT DOCUMENTS

| | | | |
|---|---|---|---|
| 3,708,692 | 1/1973 | Matuoka | 328/185 |
| 4,268,794 | 5/1981 | Handre et al. | 328/185 |

*Primary Examiner*—Vincent P. Canney
*Attorney, Agent, or Firm*—Joel D. Talcott; Elizabeth E. Strnad

[57] ABSTRACT

Circuit and method for providing a D.C. controlled adjustable ramp signal which maintains a predetermined ramping period for respectively adjusted optimum signal levels within the operating range. An example of a circuit of the invention is described for providing an automatically controlled bias or erase ramp signal in a magnetic recorder.

17 Claims, 4 Drawing Figures

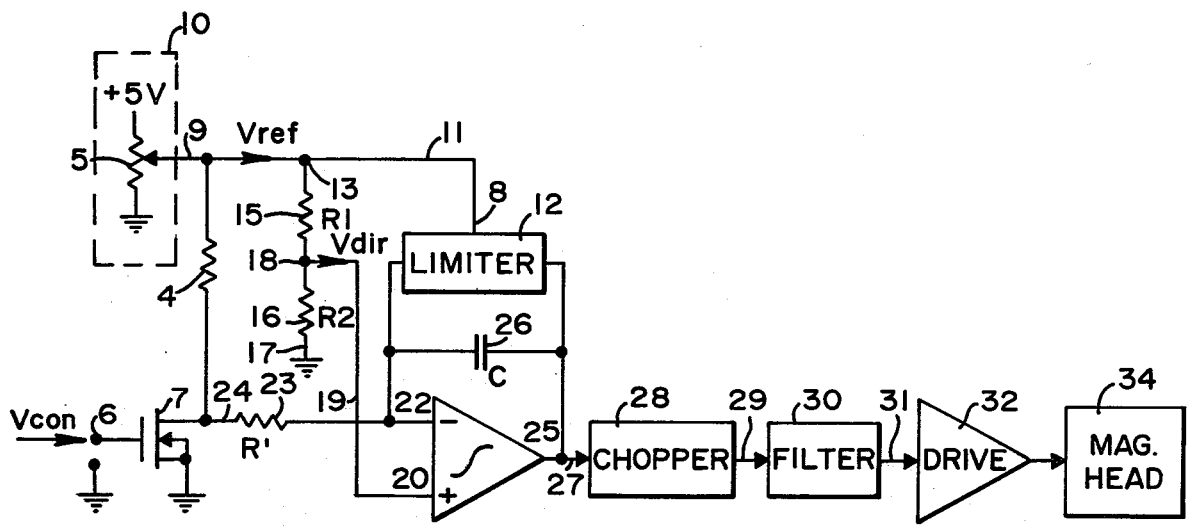
FIG_1
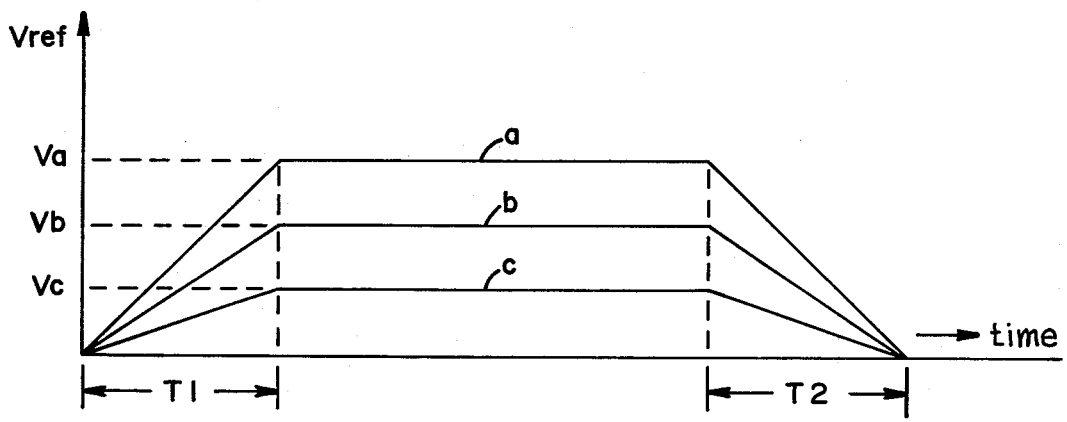
FIG_2

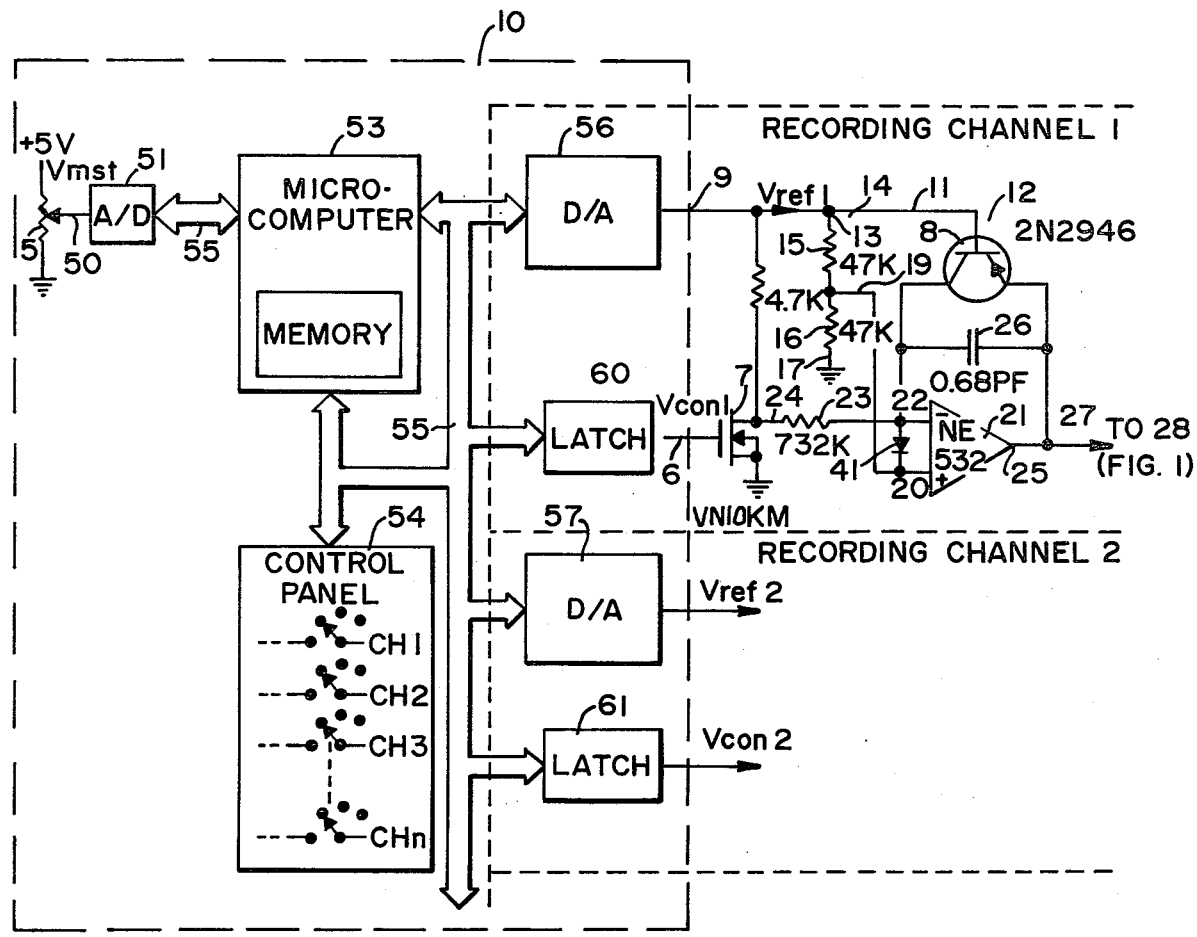
FIG_3
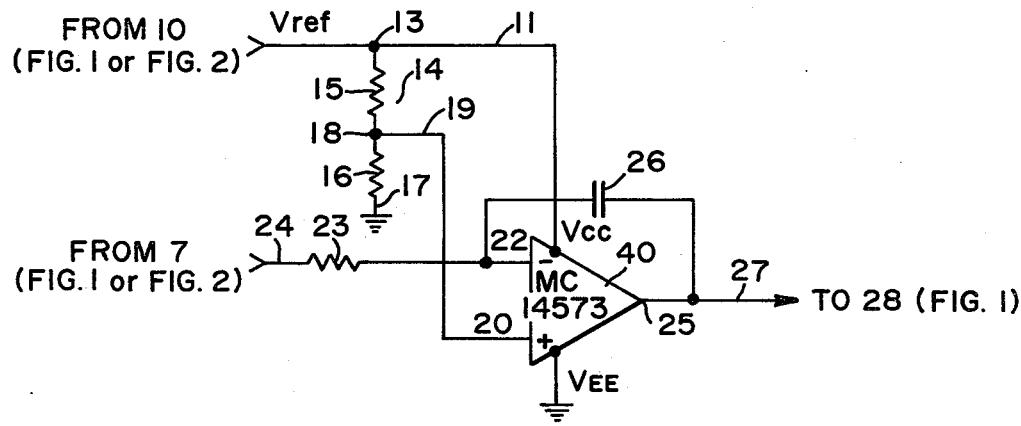
FIG_4

D.C. CONTROLLED ADJUSTABLE RAMP SIGNAL GENERATOR AND METHOD

Cross reference is hereby made to a related patent application Ser. No. 364,691 concurrently filed on Apr. 2, 1982 with this application, entitled "Circuit and Method for Generating A Ramp Signal", by John S. Fawkes and commonly assigned to the assignee of this application.

The present invention relates to a circuit and method for generating a ramp signal having a D.C. controlled adjustable level and it is particularly useful for generation and automatic control of bias recording or erase signals in magnetic recording devices.

BACKGROUND OF THE INVENTION

As it is well known in the art of magnetic recording a desired high frequency audio bias recording or erase signal envelope level has to be switched on and off gradually, that is ramped-up or ramped-down, respectively, to eliminate an undesirable audible "pop" recorded on the magnetic medium. When utilized for example in video tape recorders, an optimum bias or erase level of an audio signal to be recorded has to be reached in a relatively short time for editing purposes, preferably within one video field or frame interval, that is within 30 milliseconds or less. Therefore, it is desirable to maintain a predetermined ramping period for respectively selected optimum signal levels within the operating range.

As an example, a prior art video tape recorder, type VPR-2, manufactured by Ampex Corporation, assignor of this patent application, utilizes for recording audio signals a ramped bias and erase signal generator circuit described in VPR-2 Video Production Recorder, Catalog No. 1809384-02, Page 10-7, issued in May 1980. Briefly, that prior art circuit (not shown) has an integrating operational amplifier for providing a desired ramped output voltage in reponse to an input voltage step. A voltage limiter connected to the integrator limits the output voltage therefrom to a value determined by a master bias level commonly applied as a D.C. reference voltage to all the recording channels. The limited ramped output signal from the integrator is then chopped by a solid state switch at a desired bias or erase signal frequency, and thereafter filtered to obtain a ramped high frequency sine wave signal. The thusly obtained signal is then attenuated by a potentiometer attenuator connected in the high frequency signal path in each respective channel to obtain respective desired optimum levels and thereafter the resulting attenuated signal is applied to a respective bias or erase current amplifier of that particular channel as it is well known in the art.

The above-described prior art circuit has the following disadvantages. Every time when the master bias level is changed the duration of the ramp also changes. Consequently during edits on tape when the "ramp-down" or "ramp-up" portion of a previously recorded information overlaps with a ramp portion of a newly recorded information going in the opposite direction, "holes" or "thumps" may be formed in the recorded signal envelope which in turn cause sudden disturbing changes in the edited audio signal volume. Another disadvantage is that the prior art circuit is not suitable for automatic control since the attenuator is located in the high frequency signal path, that is, at a remote location from the D.C. control circuit. The prior art circuit configuration cannot be readily adapted for use with printed wire boards. Moreover, as it is well known such potentiometers are exposed to signal level losses for example due to the temperature changes, or when utilized in multichannel recorders, to losses induced by interchannel crosstalk.

SUMMARY OF THE INVENTION

Consequently, it is an object of the invention to provide a circuit and method for generating a ramp signal which has a D.C. controlled adjustable level.

It is a further object to provide a circuit and method for generating a ramp signal having a predetermined ramping period which is maintained constant within a range of operating optimum signal levels.

It is another object to provide an automatically controlled erase or bias ramp signal generator circuit and method suitable for use in single channel or multi-channel magnetic recorders.

It is a further object to provide a circuit and method having the above-indicated features while being suitable for economical production.

BRIEF DESCRIPTION OF THE DRAWINGS

FIG. 1 is a circuit diagram of a preferred embodiment of the invention.

FIG. 2 shows respective ramp signal characteristics having different optimum D.C. levels as provided by the preferred embodiments.

FIG. 3 is a circuit diagram of another preferred embodiment of the invention.

FIG. 4. is an alternative embodiment of a portion of the circuit of FIGS. 1 or 3.

DETAILED DESCRIPTION

FIG. 1 shows a block diagram of a preferred embodiment of the invention which is described below. An adjustable D.C. voltage source and control circuit 10 provides at its output 9 a selected D.C. reference voltage value Vref which is applied via line 11 to a voltage limiter 12. Circuit 10 may be implemented for example by a suitable D.C. voltage source and an adjustable voltage divider such as a potentiometer 5 connected to a D.C. power supply to obtain a desired adjustable Vref value as it is known in the art. Alternatively, the circuit 10 may also comprise a suitable digital control circuit such as comprising an analog-to-digital converter, a microcomputer with memory which may be programmed to provide desired optimum Vref values and a digital-to-analog converter for converting the digital value obtained from the computer into analog voltage, as it will be described later in more detail with reference to FIG. 3. The above-indicated D.C. reference voltage Vref on line 11 is also applied to one terminal 13 of a voltage divider 14 comprising series resistors 15, 16 having respective resistance values R1, R2, while an opposite terminal 17 of the divider 14 is grounded. An output terminal 18 of the voltage divider 14 providing an output voltage Vdiv is connected via line 19 to a non-inverting input 20 of an integrating operational amplifier 21 whose inverting input 22 is connected via a series resistor 23 having a value R' and via line 24 to a switch 7. An input terminal 6 connected to the switch 7 receives a control signal in the form of a positive or negative D.C. voltage step. Switch 7 is driven via resistor 4 by the reference voltage Vref at output 9 from circuit 10. Switch 7 is preferably implemented by a suitable solid state switch as it is well known in the art. A feedback capacitor 26 having a value C is connected between an output 25 and the inverting input 22 of integrator 21. In parallel with capacitor 26 there is connected the previously mentioned voltage limiter 12.

The output 25 of integrator 21 is coupled via line 27 to an input of a chopper 28 whose output is coupled via line 29 to an input of a filter circuit 30. An output of the filter circuit 30 is in turn connected via line 31 to an input of a drive amplifier 32 whose output is coupled to an input of an erase or bias recording magnetic head circuit 34.

The respective circuits 28, 30, 32 and 34 which are connected in tandem following the output 25 of integrator 21 of FIG. 1 are well known in the art, for example, from the above-indicated Catalog and therefore they will be described only briefly herein. Chopper 28 is utilized to provide a high frequency square wave signal whose envelope corresponds to the output signal from integrator 21 and its frequency corresponds to a desired erase or bias signal frequency to be recorded. Filter 30 is utilized to provide a high frequency sine wave signal from the above-indicated square wave signal and drive amplifier 32 is utilized as a power amplifier to amplify the high frequency sine wave signal and to apply the same to a magnetic recording or erase head 34, as it is well known.

Now the operation of the circuit of FIG. 1 will be described with reference to the characteristics of FIG. 2.

The circuit 10 is adjusted by potentiometer 5 to provide a desired D.C. voltage level at its output 9 corresponding to an optimum bias or erase signal envelope level Vref as it is known in the art. As an example, voltage characteristics a, b, c, having respective optimum levels Va, Vb, Vc are shown in FIG. 2. A control signal in the form of a positive or negative voltage step (not shown) received at input terminal 6 effects a voltage step of opposite direction from switch 7 on line 24. The later voltage step is applied via series resistor 23 to the inverting input 22 of integrator 21. As a result a positive going linear voltage ramp is provided at output 25 of that integrator, also commonly referred to as "ramp-up" voltage as it is shown during time period T1 of FIG. 2. The limiter 12 limits the level of the postive going ramp voltage to a selected optimum value such as shown by any of the previously mentioned values Va to Vc and thereafter maintains that value constant until a negative going "ramp-down" characteristic is initiated by a positive step voltage received at input 22 of integrator 21 from switch 7, as it is well known in the art.

There is an important difference and advantage in the operation of the circuit of FIG. 1 over the prior art circuits as follows. The non-inverting input 20 of integrator 21 receives via line 19 a voltage Vdiv which is equal to a predetermined ratio of the selected reference voltage Vref obtained at output 9 of control circuit 10. Consequently, when Vref is changed, the voltage Vdiv at non-inverting input 20 of integrator 21 changes in linear proportion therewith while maintaining a constant ratio between the reference voltage Vref on line 11 and the output voltage Vdiv from divider 14 on line 19. In the preferred embodiment the respective resistor values of the voltage divider 14 are selected equal, that is R1=R2. Accordingly, the above-indicated voltage ratio is Vref: Vdiv=2:1. As a result, the "ramp-up" and "ramp-down" periods shown in FIG. 2 are equal, that is $$T1 = T2 = 2R'C \tag{1}$$

where R' is a selected resistance value of series resistor 23 and C is a selected capacitance value of capacitor 26. Equation (1) may be easily derived from the well known theory of integrating circuits.

It will be understood by those skilled in the art that while the above-indicated ratio 1:1 of the resistor values R1, R2 is particularly useful in audio bias signal recording or erase of the preferred embodiment, in other applications it may become desirable to select different resistance ratios such as 1:2, 2:3, etc., to obtain different time periods T1, T2 and thus to provide different ramp-up and ramp-down slopes of the voltage envelope, respectively.

It is seen from the foregoing description that while the voltage Vdiv at input 20 of the integrator 21 is derived from the reference voltage Vref on line 11 as a selected portion thereof, the same voltage Vref also determines the voltage limit provided by the integrator 21 at its output 25. Thus the voltage Vdiv at input 20 changes in a known linear proportion with a change of the selected voltage limit on line 11. However, whenever the voltage Vref from the control circuit is changed to provide a new optimum voltage level on line 11, as it is shown for example in FIG. 2 by the characteristics a to c, the above-described time intervals of the preferred embodiment remain the same, that is T1=T2 as previously indicated by equation (1) while the slope of the ramp changes within that interval to obtain the changed optimum voltage level Va to Vc.

It is also seen that a desired ramp as well as a desired optimum level of the high frequency signal envelope are respectively obtained by utilizing D.C. voltage control means, while use of a conventional potentiometer attenuator in the high frequency signal path is eliminated in the circuit of the invention. Consequently, the circuit in accordance with the invention does not suffer from signal level losses due to temperature changes or, when utilized in multi-channel recorder, from inter-channel crosstalk induced in potentiometers which are utilized for high frequency signal attenuation in the prior art circuits.

Now FIG. 3 will be described, showing a circuit diagram of another preferred embodiment of the invention which in part corresponds to the above-described circuit of FIG. 1. It is noted that corresponding circuit elements in all the respective drawing figures are designated by similar reference numerals to facilitate comparison.

As it follows from the foregoing description, it is a significant advantage of the present invention that it may be utilized as an automatically controlled ramp signal generating circuit, such as for generation of bias or erase signals. An example of such a circuit is shown in FIG. 3 and it will be described below. In certain applications, for example in high quality multichannel audio recorders it is of great importance to obtain flexibility in generation of desired optimum bias and erase signal levels for each channel, to maintain stability of these levels, as well as accurate ramping and timing of these signals such as for editing purposes. As it is well known, in multichannel devices each channel may require a slightly different optimum signal level due to the differences in the characteristics of these channels. FIG. 3 shows a preferred embodiment of the invention which provides automatic control taking into consideration the above-indicated parameters. For example, a desired reference voltage level common to all the channels, such as the previously mentioned master signal level Vmst may be set by an operator utilizing a potentiometer 5 described before with reference to FIG. 1. The signal Vmst is applied via line 50 to an analog-to-digital converter 51, for example type AD7574 manufactured by Analog Devices Corp. The corresponding digital signal from A/D converter 51 is applied via an address and data bus 55 to a digital control circuit with memory 53, in a manner well known in the art. For example, circuit 53 may be implemented by a microcomputer, type 8048 manufactured by Intel Corporation. The microcomputer stores in its memory data pertaining to the above-indicated respective characteristic parameters of each channel. For example, the stored data may indicate respective desired percentages of different master voltage levels Vmst necessary to obtain an optimuim reference voltage Vref for each channel. The microcomputer 53 is connected via bus 55 to respective latching digital-to-analog converters 56, 57, etc., each pertaining to one recording channel. For example circuits 56, 57 may be selected as type AM6080 manufactured by Advanced Micro Devices Corporation. In operation, the microcomputer 53 sequentially addresses the respective latching D/A converters 56, 57, etc., and applies a digital signal thereto corresponding to an optimum value Vref1, Vref2, etc., as required by each channel. The latter digital values are converted into corresponding analog values by each converter 56, 57, etc., and applied to the analog portion of the circuit of FIG. 3 in a manner corresponding to that previously described with reference to FIG. 1. For example the latching D/A circuit 56 of channel 1 applies a reference voltage Vref1 on line 11 to the voltage divider 14 and limiter 12, respectively, as it is shown in FIG. 3 and as it has been described above.

In the circuit of FIG. 3 latches 60, 61, etc., for example type 74LS74 are utilized to apply the previously described positive or negative control voltage step Vcon1, Vcon2, etc., to a respective switch of each channel, such as switch 7 of channel 1. The respective latches 60, 61, etc., are controlled via the address and data bus 55 from the microcomputer 53 in response to a control signal received thereby for example from a control panel 54. The control panel 54 may comprise control switches for selecting an individual recording channel and a desired operation mode as it is well known in the art and as illustrated by switches designated CH1 to CHn within the control panel 54.

Thus, when a particular channel, such as channel 1 is selected for recording, switch CH1 on control panel 54 is set by the operator in a corresponding position, while control panel 54 applies a corresponding signal via bus 55 to microcomputer 53. The microcomputer 53 in turn addresses latch 60 and applies a corresponding control signal thereto. Latch 60 in turn applies a positive control voltage step Vcon on line 6 to switch 7, thus initiating an increasing ramp signal on line 27, as it has been described previously. Analogously, when it is desired to interrupt the recording mode in channel 1, switch CH1 is turned to a corresponding position thus effecting the latch 60 to be controlled via bus 55 to apply an opposite voltage step Vcon which in turn effects a decreasing ramp signal on line 27.

It will be understood from the foregoing description that while only one recording channel is shown in detail in FIG. 3, any desired number of similar channels may be controlled by the control circuit 10 of FIG. 3 in a manner described above.

In the embodiment of FIG. 3 the limiter 12 of FIG. 1 is implemented by a transistor having its emitter connected to the output 25 of integrator 21, while its collector is coupled to the inverting input 22 of the integrator. The base of transistor 12 is connected via line 11 to the output 9 of the adjustable D.C. voltage source and control circuit 10, wherefrom it obtains the previously described optimum reference voltage Vref. Consequently, when Vref is applied to the base 8 of transistor 21, the output voltage therefrom is limited to the maximum emitter-to-collector voltage as determined by Vref. A clamping diode 41 is coupled between the respective inputs 20, 22 of amplifier 21 to maintain a predetermined voltage difference therebetween.

FIG. 4 shows an alternative embodiment of a portion of the above-described circuit of FIG. 3 as follows. Instead of a bipolar transistor type amplifier shown at 21 in FIG. 1 the integrating operational amplifier is implemeted by a CMOS type amplifier 40. In the embodiment of FIG. 4 the reference voltage Vref on line 11 is applied directly into Vcc source voltage input of amplifier 40 which voltage sets the limit for a maximum output signal value on line 27 from the operational amplifier 40. It is seen that in the embodiment of FIG. 4 the voltage limiter 12 of FIGS. 1 and 3 is deleted while the operation of the integrator 40 remains substantially the same as previously described with reference to FIG. 1 and 3. It is noted that the remaining portions of the circuits of FIGS. 1, 3 and 4 are similar and are designated by like reference numerals to facilitate comparison and consequently their description will not be repeated herein with respect to FIG. 4.

While the invention has been shown and described with particular reference to preferred and alternative embodiments thereof, it will be understood that variations and modifications in form and details may be made therein without departing from the spirit and scope of the invention as defined in the appended claims.

What is claimed is:

1. A circuit for generating a D.C. controlled adjustable ramp signal, comprising:
    an adjustable D.C. reference voltage source having an output coupled to provide a desired adjustable D.C. reference voltage;
    a first means having an input coupled to receive said adjustable D.C. reference voltage and having an output coupled to provide a predetermined ratio thereof;
    an integrating means having an inverting input coupled to receive a positive or negative D.C. input step voltage for responsively coupling said inverting input to said adjustable D.C. reference voltage or ground, respectively, having a non-inverting input coupled to said output of said first means for receiving said predetermined ratio of said adjustable D.C. reference voltage and having an output coupled to provide said ramp signal in response to said D.C. input step voltage; and said integrating means being further coupled to receive said adjustable D.C. reference voltage and to limit a maximum value of said ramp signal provided thereby to a value determined by said adjustable D.C. reference voltage.

2. The circuit of claim 1 wherein said integrating means comprises a series input resistor coupled between an input terminal for receiving said input step voltage and said inverting input and a feedback capacitor coupled between said output and said inverting input of said integrating means, and wherein a time interval necessary for ramping-up and ramping-down said ramp signal with reference to said maximum value is determined respectively by respective values of said input resistor, feedback capacitor and by said predetermined ratio of said adjustable D.C. reference voltage, whereby said time interval is constant for all selected values of said adjustable D.C. reference voltage within a selected operating range.

3. The circuit of claim 2 wherein said first means comprises a voltage divider means having one terminal coupled to said output of said adjustable D.C. reference voltage source, having a second, opposite terminal grounded and having a third terminal provided between said first and second terminal, respectively, corresponding to said output of said first means.

4. The circuit of claim 3 wherein said voltage divider means comprises resistor means.

5. The circuit of claim 4 wherein a resistance value between said first and third terminal and between said second and third terminal of said resistor means is selected equal to obtain said time interval necessary for ramping-up equal to that which is necessary for ramping-down said ramp signal.

6. The circuit of claim 1 wherein said integrating means further comprises a voltage limiter having an input and an output coupled between said inverting input and said output of the integrating means and having a control input coupled to said output of said adjustable D.C. reference voltage source for receiving said adjustable D.C. reference voltage provided thereby.

7. The circuit of claim 6 wherein said voltage limiter comprises a transistor means having a emitter coupled to said output of said integrating means, a collector to said inverting input of said integrating means and a base to said output of said adjustable D.C. reference voltage source.

8. The circuit of claim 1 wherein said integrating means comprises a CMOS type integrating operational amplifier means having an input coupled to receive said adjustable D.C. reference voltage as its source voltage to limit thereby said maximum value of said ramp signal provided by said amplifier means.

9. The circuit of claim 1 further comprising;
an analog-to-digital converter means having an input coupled to receive said adjustable D.C. reference voltage and to responsively provide a digital output signal;
a memory means coupled to store digital information related to a desired optimum signal level to be obtained by said ramp signal;
a digital control means coupled to both said memory means and to said analog-to-digital converter means to receive said digital output signal therefrom and to responsively provide an output signal in a known proportion to said output signal of said converter means as determined by said information stored in said memory means;
a digital-to-analog converter means coupled to receive said output signal provided by said digital control means and to responsively provide a corresponding analog D.C. voltage value;
a first means having an input coupled to receive said analog D.C. voltage value from said digital-to-analog converter means and having an output coupled to provide a predetermined ratio thereof;
an integrating means having an inverting input coupled to receive a positive or negative D.C. input step voltage for responsively coupling said inverting input to said adjustable D.C. reference voltage or ground, respectively, having a non-inverting input coupled to an output of said first means and having an output coupled to provide said ramp signal in response to said D.C input step voltage; and
said integrating means being further coupled to receive said analog D.C. voltage value from said digital-to-analog converter means and to limit a maximum value of said ramp signal provided thereby to said desired optimum signal level determined by said analog voltage value received from said digital-to-analog converter means.

10. The circuit of claim 9 further comprising a switch means coupled to said inverting input of said integrating means and wherein said D.C. input step voltage is applied to said inverting input via said switch means by said control means in response to a control signal received thereby.

11. A circuit for generating a D.C. controlled adjustable ramp signal, comprising:
an adjustable D.C. reference voltage source having an output coupled to provide a desired adjustable D.C. reference voltage value;
a resistive voltage divider means having one terminal coupled to said output of said adjustable D.C. reference voltage source and having a second, opposite terminal grounded;
an integrating means having an inverting input coupled to receive a positive or negative D.C. input step voltage for responsively coupling said inverting input to said adjustable D.C. reference voltage or ground, respectively, having a non-inverting input coupled to an output of said voltage divider means for receiving a predetermined ratio of said adjustable D.C. reference voltage value and having an output coupled to provide said ramp signal in response to said D.C. input step voltage; and
said integrating means being further coupled to receive said adjustable D.C. reference voltage and to limit a maximum value of said ramp signal provided thereby to a value determined by said adjustable D.C. reference voltage.

12. A circuit for generating a D.C. controlled adjustable ramp signal, comprising;
an adjustable D.C. reference voltage source having an output coupled to provide a desired adjustable D.C. reference voltage value;
a resistive voltage divider means having a first terminal coupled to said output of said adjustable D.C. reference voltage source having a second, opposite terminal grounded, and having a third, output terminal provided between said first and second terminal, respectively;
an integrating means having an inverting input coupled to receive a positive or negative D.C. input step voltage for responsively coupling said inverting input to said adjustable D.C. reference voltage or ground, respectively, having a non-inverting input coupled to said output terminal of said voltage divider means for receiving a predetermined ratio of said adjustable D.C. reference voltage value and having an output coupled to provide said ramp signal in response to said D.C. input step voltage;

said integrating means being further coupled to receive said adjustable D.C. reference voltage and to limit a maximum value of said ramp signal provided thereby to a value determined by said adjustable D.C. reference voltage; and wherein a resistance value between said first and third terminal and between said second and third terminal of said resistive voltage divider means is selected equal to obtain a time interval necessary to ramping-up equal to that which is necessary for ramping-down said ramp signal with reference to said maximum value.

13. A circuit for generating a D.C. controlled adjustable ramp signal, comprising:
an adjustable D.C. reference voltage source having an output coupled to provide a desired adjustable D.C. reference voltage;
an analog-to-digital converter means having an input coupled to receive said adjustable D.C. reference voltage and to responsively provide a digital output signal;
a memory means coupled to store digital information related to a desired optimum signal level to be obtained by said ramp signal;
a digital control means coupled to both said memory means and to said analog-to-digital converter means to receive said digital output signal from said converter means and to responsively provide an output signal in a known proportion thereto as determined by said information stored in said memory means;
a digital-to-analog converter means coupled to receive said output signal provided by said digital control means and to responsively provide a corresponding analog D.C. voltage value;
a first means having an input coupled to receive said analog D.C. voltage value from said digital-to-analog converter means and having an output coupled to provide a predetermined ratio thereof;
an integrating means having an inverting input coupled to receive a positive or negative D.C. input step voltage for responsively coupling said inverting input to said adjustable D.C. reference voltage or ground, respectively, having a non-inverting input coupled to an output of said first means and having an output coupled to provide said ramp signal in response to said D.C. input step voltage; and
said integrating means being further coupled to receive said D.C. voltage value from said digital-to-analog converter means and to limit a maximum value of said ramp signal provided thereby to said desired optimum value determined by said D.C. voltage value received from said digital-to-analog converter means.

14. A circuit for providing an automatically controlled bias recording or erase ramp signal in a multi-channel magnetic recorder, comprising:
an adjustable D.C. reference voltage source having an output coupled to provide a desired D.C. reference voltage;
an analog-to-digital converter means having an input coupled to recieve said D.C. reference voltage and to responsively provide a digital output signal;
a memory means coupled to store digital information related to respective optimum signal levels required by each channel, respectively;
a digital control means coupled to both said memory means and to said converter means to receive said digital output signal of said analog-to-digital converter means and to responsively provide respective output signals in respective proprotions to said output signal of said converter means as determined by said informatin stored in said memory means with respect to each said channel;
a digital-to-analog converter means coupled to receive said respective output signals provided by said digital control means and to responsively provide corresponding analog D.C. reference voltage values;
each channel further comprising:
a first means having an input coupled to receive one said analog D.C. reference voltage value pertaining to that particular channel and having an output coupled to provide a predetermied ratio hereof;
an integrating means having an inverting input coupled to receive a positive or negative D.C. input step voltage for responsively coupling said inverting input to said adjustable D.C. reference voltage or ground, respectively, having a non-inverting input coupled to an output of said first means and having an output coupled to provide a ramp signal in response to said D.C. input step voltage; and
said integrating means being further coupled to receive said analog D.C. reference voltage value and to limit a maximum value of said ramp signal provided thereby to a value determined by said analog D.C. reference voltage.

15. The circuit of claim 14 wherein said D.C. input step voltage is applied to a particular channel by said control means in response to a control signal received thereby.

16. The circuit of claim 14 wherein said first means comprises a resistive voltage divier means having one terminal coupled to said output of said adjustable D.C. reference voltage source, having a second, opposite terminal grounded and having a third terminal provided between said first and second teminal, respectively, corresponding to said output of said first means and wherein a resistance value between said first and third terminal and between said second and third terminal of said resistive voltage divider means is selected equal to obtain a time interval necessary for ramping-up equal to that which is necessary for ramping-down said ramp signal with respect to said maximum value.

17. A method of providing a D.C. controlled adjustable ramp signal, comprising the steps of:
providing an adjustable D.C. reference voltage;
providing a predetermined ratio of said adjustable D.C. reference voltage;
providing an integrated D.C. ramp voltage in response to a positive or negative D.C. input step signal having a selected integrating time constant;
limiting said D.C. ramp voltage to a maximum value determined by said adjustable D.C. reference voltage; and
providing a time interval necessary for ramping-up and ramping-down said ramp signal with reference to said maximum value, respectively, determined by said integrating time constant and by said predetermined ratio.

* * * * *